(12) United States Patent  
Uehara

(10) Patent No.: US 7,919,704 B2  
(45) Date of Patent: Apr. 5, 2011

(54) VOICE SIGNAL BLOCKER, TALK ASSISTING SYSTEM USING THE SAME AND MUSICAL INSTRUMENT EQUIPPED WITH THE SAME

(75) Inventor: Haruki Uehara, Shizuoka-ken (JP)

(73) Assignee: Yamaha Corporation, Shizuoka-Ken (JP)

( * ) Notice: Subject to any disclaimer, the term of this patent is extended or adjusted under 35 U.S.C. 154(b) by 302 days.

(21) Appl. No.: 12/260,468

(22) Filed: Oct. 29, 2008

(65) Prior Publication Data

US 2009/0114080 A1  May 7, 2009

(30) Foreign Application Priority Data

Nov. 6, 2007  (JP) ................................. 2007-288018

(51) Int. Cl.  
*G10H 1/00*  (2006.01)

(52) U.S. Cl. ................ 84/615; 84/653; 84/600; 381/56; 381/118; 381/119; 381/122; 381/123

(58) Field of Classification Search ............ 84/600–602, 84/615, 653; 381/56, 118, 119, 122, 123  
See application file for complete search history.

(56) References Cited

U.S. PATENT DOCUMENTS

| | | | | |
|---|---|---|---|---|
| 3,605,020 A | * | 9/1971 | Sullivan, Jr. .................. 455/116 |
| 3,994,196 A | * | 11/1976 | Hamil ............................. 84/273 |
| 4,357,492 A | * | 11/1982 | Campbell et al. ............. 381/107 |
| 4,604,501 A | * | 8/1986 | Richmond et al. ........ 379/388.05 |
| 5,148,491 A | * | 9/1992 | Sakamoto et al. ............. 381/119 |
| 5,404,397 A | * | 4/1995 | Janse et al. ................ 379/202.01 |
| 5,452,474 A | * | 9/1995 | Kagawa ...................... 455/569.1 |
| 5,673,327 A | * | 9/1997 | Julstrom ........................ 381/119 |
| 5,715,302 A | * | 2/1998 | Lee .......................... 379/100.16 |
| 5,818,949 A | * | 10/1998 | Deremer et al. .............. 381/172 |
| 6,374,123 B1 | * | 4/2002 | Kim ............................ 455/556.1 |
| 6,760,457 B1 | * | 7/2004 | Bren et al. ..................... 381/331 |
| 2005/0232447 A1 | * | 10/2005 | Shinozuka et al. ........... 381/122 |
| 2006/0075347 A1 | * | 4/2006 | Rehm ........................... 715/727 |
| 2006/0083392 A1 | * | 4/2006 | Akino ........................... 381/122 |
| 2007/0160240 A1 | * | 7/2007 | Ito et al. ........................ 381/300 |
| 2007/0183609 A1 | * | 8/2007 | Jenn .............................. 381/312 |
| 2007/0291956 A1 | * | 12/2007 | Loether .......................... 381/80 |
| 2008/0077388 A1 | * | 3/2008 | Nash et al. ........................ 704/3 |
| 2008/0165988 A1 | * | 7/2008 | Terlizzi et al. ................ 381/119 |
| 2010/0150372 A1 | * | 6/2010 | Ito et al. .......................... 381/77 |

FOREIGN PATENT DOCUMENTS

JP      2002142299 A  *  5/2002

* cited by examiner

*Primary Examiner* — David S. Warren  
(74) *Attorney, Agent, or Firm* — Harness, Dickey & Pierce, PLC

(57) ABSTRACT

A talk assisting system has a vibration sensor for detecting tones produced through a musical instrument and a signal interrupter connected between a microphone and a sound system; while a player is fingering a music tune on the musical instrument, pieces of vibration data express a wide amplitude of the vibrations, and a tone discriminator changes a state signal to an active high level; and the signal interrupter is responsive to the state signal so as to block the sound system from the voice signal, whereby the tones are not mixed with the voice.

9 Claims, 12 Drawing Sheets

VOICE SIGNAL BLOCKER, TALK ASSISTING SYSTEM USING THE SAME AND MUSICAL INSTRUMENT EQUIPPED WITH THE SAME

FIELD OF THE INVENTION

This invention relates to a voice signal blocker and, more particularly, to a voice signal blocker for preventing voice from noise, a talk assisting system using the voice signal blocker and a musical instrument equipped with the talk assisting system.

DESCRIPTION OF THE RELATED ART

A musician sometimes gives a talk to his or her audience on the music or performance in a live concert. Similarly, a music teacher or a music tutor gives instructions and reviews to the students in a music lesson among his or her exhibition of music performance. In this situation, the musician and music teacher talks to the audience and students through a microphone. The voice is picked up through the microphone, and is converted to the audio signal. The audio signal is amplified, and is converted to the voice through the loudspeakers or headphones. Even if the musician and music teachers are remote from the audience and students, the audience and students clearly hear his or her voice.

However, the microphone converts not only the voice but also the instrument sound and noise to the audio signal. While the musician and music teachers are talking, the instrument sound and noise make the audience and students feel uncomfortable.

In order to prevent the audience and students from the uncomfortable sound, the loudness may be controlled for the audience and students. A loudness controlling technique is disclosed in Japan Patent Application laid-open No. 2006-74409. The loudness controlling technique is employed in the microphone. The prior art microphone is varied in gain in dependence on the sensitivity to be required. However, the prior art microphone can not discriminate target sound from unnecessary noise. In other words, the prior art microphone does not have any selectivity on sources of sound.

SUMMARY OF THE INVENTION

It is therefore an important object of the present invention to provide a voice signal blocker, which has selectivity on sound waves depending upon the present state of a sound source.

It is another important object of the present invention to provide a talk assisting system, in which said voice signal blocker is incorporated.

It is also an important object of the present invention to provide a musical instrument, which is equipped with the talk assisting system.

To accomplish the objects, the present invention proposes to control a signal interrupter with a detecting signal representative of the presence or absence of sound or music sound.

In accordance with one aspect of the present invention, there is provided a voice signal blocker for blocking a sound system from a voice signal produced through a voice-to-signal converter comprising a signal interface receiving a voice signal supplied from the voice-to-signal converter and a detecting signal from a sound detector, a sound discriminator connected to the signal interface, checking pieces of sound data expressed by the detecting signal to see whether or not sound is produced and producing a blocking signal representative of presence of the sound when the pieces of sound data express generation of the sound, and a signal interrupter connected between the signal inputs and a sound system, responsive to the blocking signal so as to block the sound system from the voice signal and permitting the voice signal to reach the sound system in the absence of the blocking signal.

In accordance with another aspect of the present invention, there is provided a talk assisting system for assisting a player with a talk comprising a voice-to-signal converter picking up voice of the player and converting the voice to a voice signal, a sound detector monitoring a source of sound and producing a detecting signal representative of generation of sound through the source of sound, a sound system supplied with the voice signal and enlarging the voice and a voice signal blocker, and the voice signal blocker includes a signal interface connected to the voice-to-signal converter and the sound detector and receiving the voice signal and the detecting signal, a sound discriminator connected to the signal interface, checking pieces of sound data expressed by the detecting signal to see whether or not the sound is produced and producing a blocking signal representative of presence of the sound when the pieces of sound data express generation of the sound and a signal interrupter connected between the signal inputs and the sound system, responsive to the blocking signal so as to block the sound system from the voice signal and permitting the voice signal to reach the sound system in the absence of the blocking signal.

In accordance with yet another aspect of the present invention, there is provided a musical instrument for producing music sound comprising plural manipulators selectively depressed and released for specifying tones to be produced, a tone generator connected to the plural manipulators and producing the tones as music sound and a talk assisting system, and the talk assisting system includes a voice-to-signal converter picking up voice of a player and converting the voice to a voice signal, a music sound detector monitoring the tone generator and producing a detecting signal representative of generation of the music sound, a sound system supplied with the voice signal and enlarging the voice and a voice signal blocker having a signal interface connected to the voice-to-signal converter and the music sound detector and receiving the voice signal and the detecting signal, a music sound discriminator connected to the signal interface, checking pieces of music sound data expressed by the detecting signal to see whether or not the music sound is produced and producing a blocking signal representative of presence of the music sound when the pieces of music sound data express generation of the music sound and a signal interrupter connected between the signal inputs and the sound system, responsive to the blocking signal so as to block the sound system from the voice signal and permitting the voice signal to reach the sound system in the absence of the blocking signal.

BRIEF DESCRIPTION OF THE DRAWINGS

The features and advantages of the voice signal blocker, talk assisting system and musical instrument will be more clearly understood from the following description taken in conjunction with the accompanying drawings, in which.

DESCRIPTION OF THE PREFERRED EMBODIMENTS

Figure 1:
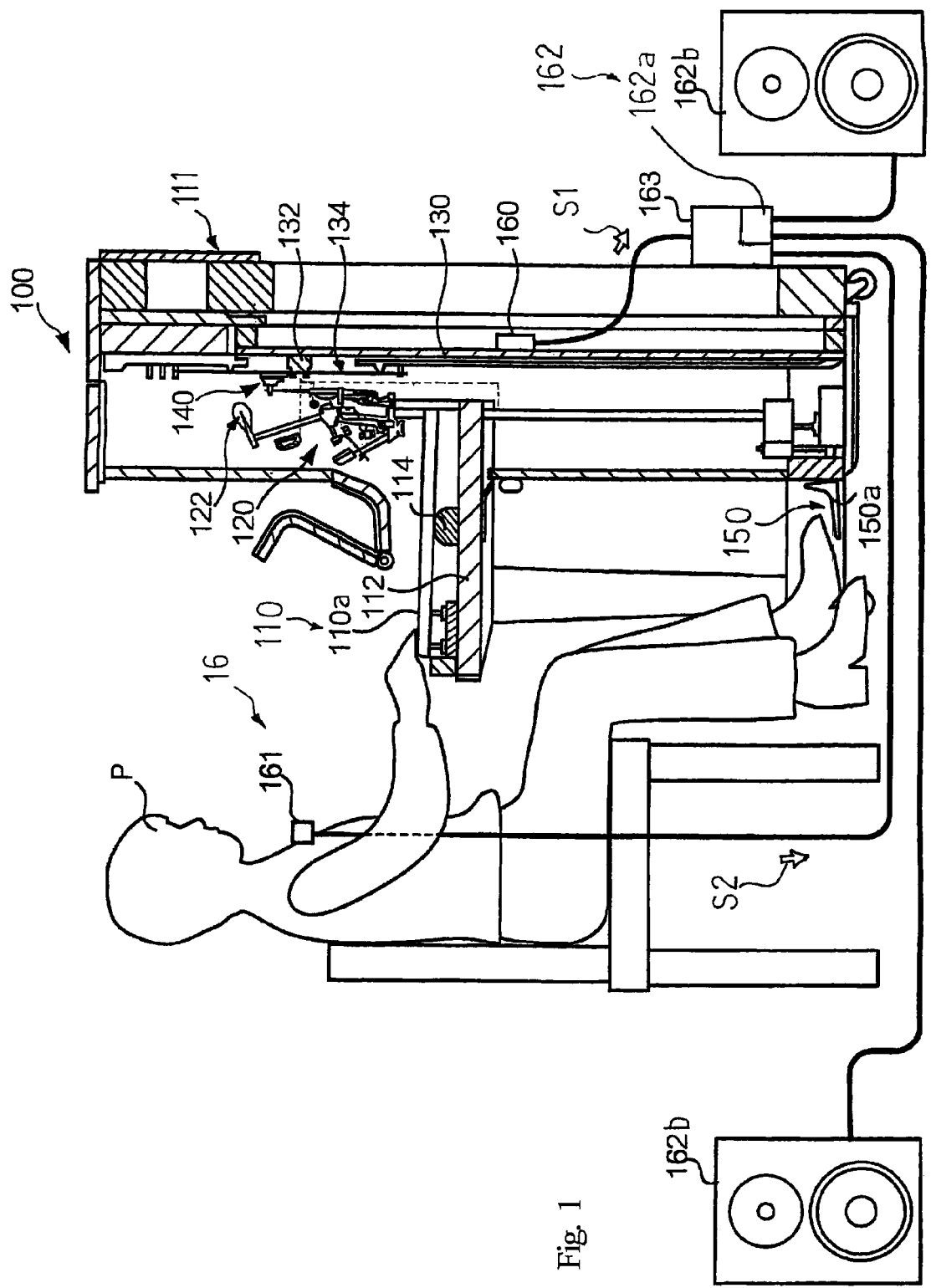
FIG. 1 is a cross sectional side view showing the structure of a musical instrument of the present invention.

A musical instrument embodying the present invention largely comprises plural manipulators, a tone generator and a talk assisting system. The plural manipulators are connected to the tone generator. A player selectively exerts force on and removes the force from the plural manipulators so as to specify music sound to be produced, and the music sound is produced through the tone generator. The player puts on the talk assisting system, and the talk assisting system is connected to the tone generator. The player talks to a people or peoples. While the player is talking without fingering on the manipulators, player's voice is enlarged through the talk assisting system. However, while the tone generator is producing the music sound, the talk assisting system is deactivated, and player's voice is not enlarged.

In detail, the talk assisting system includes a voice-to-signal converter, a music sound detector, a sound system and a voice signal blocker. The voice-to-signal converter and music sound detector are connected to the voice signal blocker, and the voice signal blocker is connected to the sound system.

The voice-to-signal converter is put on the player, and is maintained around player's mouth. The voice is picked up through the voice-to-signal converter, and is converted to a voice signal. The music sound detector is fitted to the tone generator, and monitors the tone generator. While the player is fingering on the plural manipulators, the music sound detector produces a detecting signal representative of generation of the music sound. The detecting signal express pieces of music data, and the pieces of music data express the magnitude of sound. The sound system is supplied with the voice signal through the voice signal blocker in the absence of the detecting signal, and is enlarged through the sound system. On the other hand, the voice signal blocker blocks the sound system from the voice signal in the presence of the detecting signal. For this reason, the audience clearly hears player's voice while the tone generator keeps itself silent.

The voice signal blocker has a signal interface, a music sound discriminator and a signal interrupter. The voice-to-signal converter and music sound detector are connected to the signal interface so that the voice signal and detecting signal arrive at the signal interface. The signal interface is connected to the music sound discriminator, and is further connected to the signal interrupter, which in turn is connected to the sound system. The signal interrupter has a control node, and the music sound discriminator is connected to the control node of signal interrupter.

The music sound discriminator checks the pieces of music sound data to see whether or not the music sound is produced. When the music sound discriminator acknowledges the music sound, the music sound discriminator produces a blocking signal representative of presence of the music sound. The blocking signal is supplied from the music sound discriminator to the control node of signal interrupter.

The signal interrupter is responsive to the blocking signal so as to block the sound system from the voice signal. However, the signal interrupter permits the voice signal to reach the sound system in the absence of the blocking signal.

As will be appreciated from the foregoing description, player's voice is enlarged through the talk assisting system on the condition that the music sound is not produced through the tone generator. However, while the player is fingering on the plural manipulators for producing the music sound, the talk assisting system does not enlarge the voice. As a result, the people or peoples clearly hear player's talk. The music sound is not mixed in the voice so that the people or peoples feel the music sound comfortable.

In the following description, term "front" is indicative of a position closer to a musician, who sits on a stool for fingering, than a position modified with term "rear". A line drawn between the front position and a corresponding rear position extends in a "longitudinal direction", and the longitudinal direction crosses a "lateral direction" at right angle. An "up-and-down direction" is normal with a plane defined by the longitudinal direction and lateral direction.

First Embodiment

Referring first to FIG. 1 of the drawings, a musical instrument embodying the present invention largely comprises an upright piano 100 and a talk assisting system 16. A human player P performs music tunes on the upright piano 100, and acoustic piano tones are produced through the upright piano 100 along the music score of the tunes. The talk assisting system 16 is provided in association with the upright piano 100, and the human player P talks to audience in a live concert, music students and so forth with the assistance of the talk assisting system 16. In the following description, a person or persons who hear player's voice and acoustic piano tones are simply referred to as "audience."

The talk assisting system 16 monitors the upright piano 100 to see whether or not the acoustic piano tones are produced, and increases the loudness of human voice on the condition that the acoustic piano 100 keeps itself silent. On the other hand, while the human player P is producing the acoustic piano tone through the upright piano 16, the talk assisting system 16 does not enlarge the human voice. Thus, the acoustic piano tone or acoustic piano tones are not enlarged together with the human voice. As a result, the audience does not feel the talk uncomfortable.

Structure of Upright Piano

The upright piano 100 includes a keyboard 110, action units 120, hammers 122, strings 134, dampers 140, a pedal system 150 and a piano cabinet 111. An inner space is defined inside the piano cabinet 111. The keyboard 110 is mounted on a key bed 112, which forms a part of the piano cabinet 111, and the action units 120, hammers 122, strings 134 and dampers 140 are installed in the inner space.

The keyboard 110 has plural keys 110a, and the plural keys 110a independently pitches up and down about a balance rail 114. In this instance, eighty-eight keys 110a are incorporated in the keyboard 110. Accordingly, when a player P depresses the front portions of keys 110a, the front portions are sunk toward end positions at the lower ends on loci, and the rear portions of keys 110a are lifted.

The action units 120 are respectively provided in association with the keys 110a, and the rear portions of keys 110a are respectively linked with the associated action units 120. When the player P depresses the front portions of keys 110a, the rear portions of keys 110a activates the associated action units 120. On the other hand, when the player P releases the depressed keys 110a, the action units 120 exert the self-weight on the rear portions of released keys 110a, and make the released keys 110a return to rest positions at the upper ends of the loci.

The hammers 122 are provided in association with the action units 120, and are rotatably supported by a center rail (no shown). The hammers 122 are held in contact with and separate from the associated action units 120. The strings 134 are stretched over a sound board 130, which forms a part of the piano cabinet 111, and bridges 132 keep the strings 134 spaced from the sound board 130. The hammers 122 are provided in front of the strings 134, and are respectively opposed to the strings 134. When the player P depresses the keys 110a, the action units 120 give rise to rotation of the associated hammers 122 toward the associated strings 134. The action units 120 escape from the hammers 122 in the rotation, and make the hammers 122 rotate toward the associated strings 134. The hammers 122 are brought into collision with the associated strings 134 at the end of rotation, and give rise to vibrations of associated strings 134. The vibrations of strings 134 are propagated to the sound board 130, and the acoustic piano tones are radiated from the vibrating bound board 130.

The dampers 140 are respectively provided in association with the strings 134, and are rotatably supported by the center rail (not shown) in front of the strings 134. The rear portions of keys 110a are linked with the dampers 140, respectively. While the keys 110a are staying at the rest positions, the dampers 140 are held in contact with the strings 134, and prevent the associated strings 134 from vibrations. Thus, the dampers 140 make it possible to restrict unintentional resonance among the strings 134. The depressed keys 110a make the associated dampers 140 rotate on the way toward the end positions, and the dampers 140 are respectively spaced from the associated strings 134. On the other hand, the released keys 110a permit the dampers 140 brought into contact with the vibrating strings 134 on the way toward the rest positions so that the acoustic piano tones are decayed.

The pedal system 150 is partially exposed to the feet of the player P so that the player P steps on pedals 150a of the pedal system 150 for imparting artificial expressions to the acoustic piano tones. The other end portions of pedal system 150 reach the inner space close to the hammers 122 and dampers 140. One of the other end portions prohibits the dampers 140 from contact with the vibrating strings 134 so that the dampers 140 permit the strings 134 to vibrate for a time period longer than usual. Another of the other end portions makes the rest positions of hammers 122 closer to the strings 134 so that the hammers 122 is softly brought into collision with the strings 134. Thus, the player P prolongs and lessens the acoustic piano tones by means of the pedal system 150.

System Configuration of Talk Assisting System

The talk assisting system 16 includes a vibration sensor 160, a headset microphone 161, a sound system 162 and a voice signal blocker 163. The vibration sensor 160 is fitted to the rear surface of the sound board 130, and the player P puts on the headset microphone 161. The headset microphone 161 converts sound waves expressing player's voice to a voice signal S2. The vibration sensor 160 and headset microphone 161 are connected to the voice signal blocker 163 through suitable cables, and the voice signal blocker 163 is connected to the sound system 162.

In this instance, the vibration sensor 160 is implemented by an acceleration sensor. While the sound board 130 is being excited with the vibrations of strings 134, the acceleration is exerted on the sound board 130, and the vibration sensor 160 converts the acceleration to an acceleration signal S1. The acceleration signal S1 is supplied from the vibration sensor 160 to the voice signal blocker 163, and the voice signal blocker 163 analyzes the acceleration signal S1 to see whether or not the sound board 130 is excited with the intentionally produced piano tones. While the acoustic piano tones are being produced through the intentionally vibrated strings 134, the sound board 130 widely vibrates, and the displacement of sound board 130 is also widely varied. The displacement of sound board 130 and, accordingly the amplitude of waveform expressing the vibrations are determined on the basis of values of the acceleration. The displacement of sound board 130 is well proportional to the magnitude of vibrations. On the other hand, when the noise gives rise to vibrations of the sound board 130 due to other sorts of collision between the other component parts, the acceleration is small so that the sound board 130 vibrates in a narrow range. When the voice signal blocker 163 determines the sound board 130 to be intentionally vibrated, the voice signal blocker 163 interrupts the voice signal S2 so that the sound system 162 keeps itself silent. On the other hand, when the voice signal blocker 163 determines that the sound board 130 merely vibrates due to the noise, the voice signal blocker 163 supplies the voice signal S2 to the sound system 162, and the voice of player P is enlarged through the sound system 162.

The sound system 162 includes amplifiers 162a and loudspeakers 162b. The voice signal blocker 163 is connected to the amplifiers 162a, and the amplifiers 162a is connected to the loud speakers 162b. While the voice signal blocker 163 is transparent to the voice signal S2, the voice signal S2 is equalized and increased in magnitude through the amplifiers 162a, and, thereafter, is supplied to the loudspeakers 162b. The loud voice is radiated from the loudspeakers 162b.

Functions of Voice Signal Blocker

Figure 2:
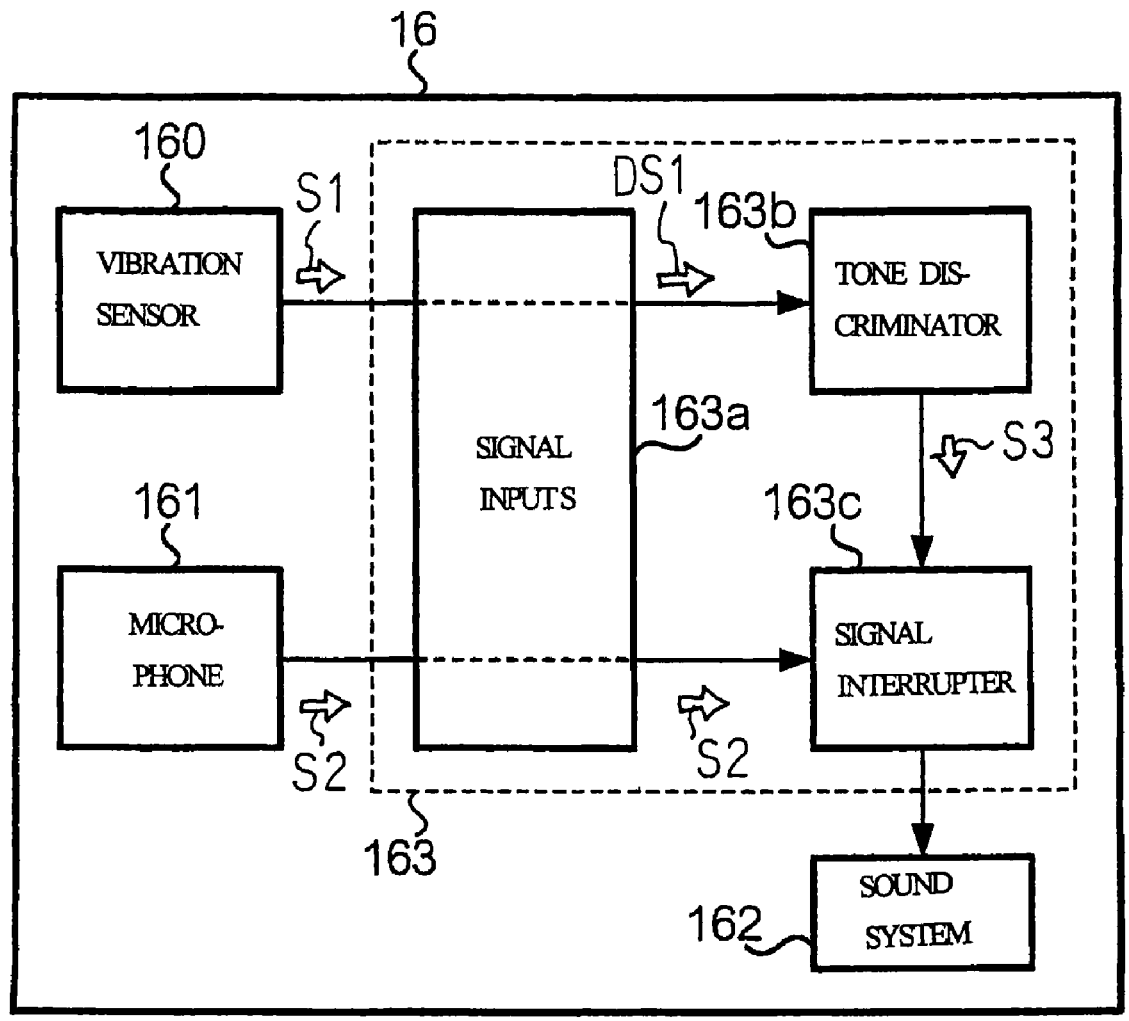
FIG. 2 is a block diagram showing functions of a talk assisting system of the musical instrument.
Figure 3:
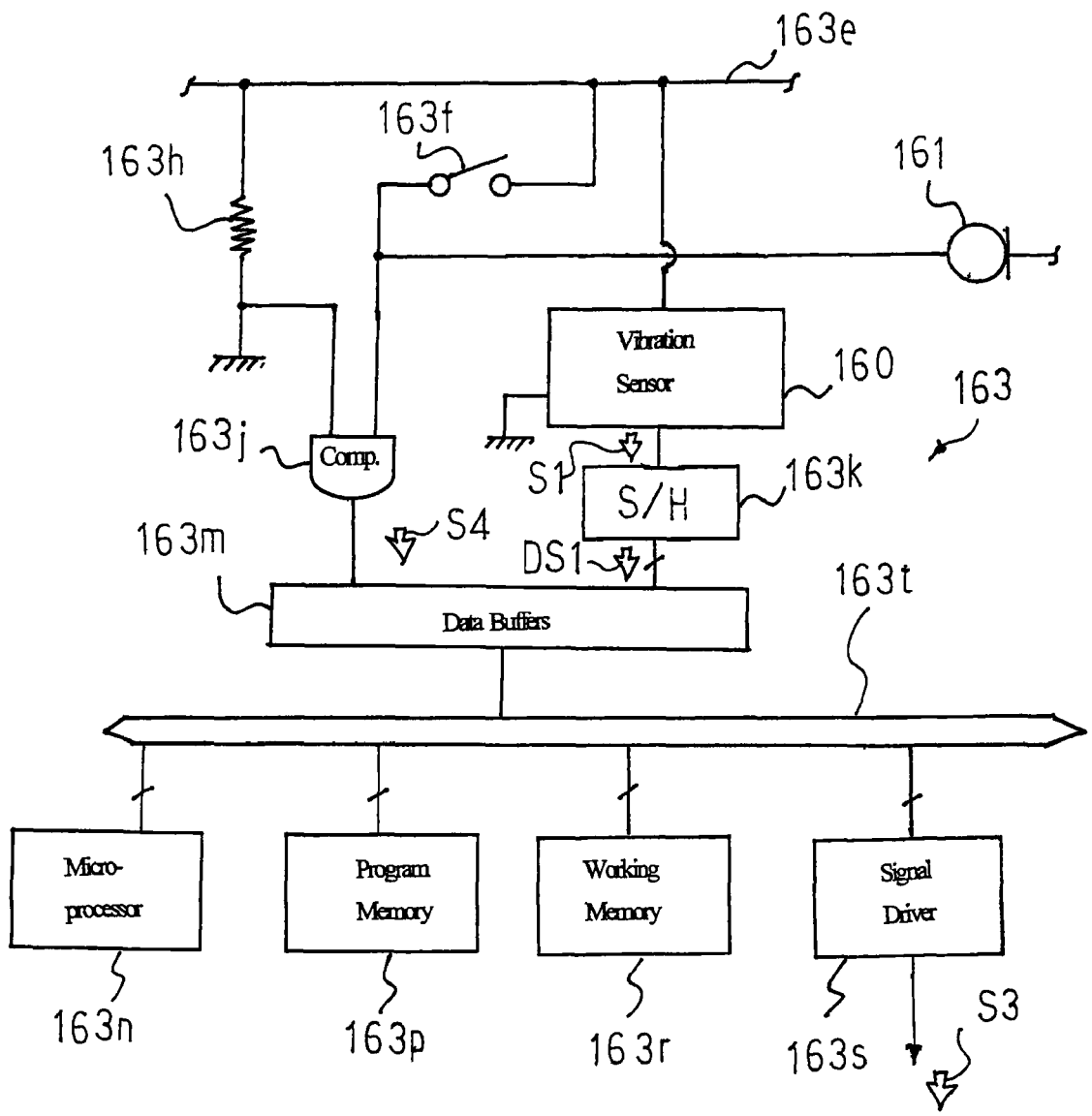
FIG. 3 is a circuit diagram showing the hardware for a voice signal blocker of the talk assisting system.

Turning to FIG. 2 of the drawings, boxes 163a, 163b and 163c stand for functions of the voice signal blocker 163, and the functions of voice signal blocker 163 are called as "signal input" 163a, "tone discriminator" 163b and "signal interrupter" 163c. The acceleration signal S1 and voice signal S2 arrive at the signal inputs 163a. Although the voice signal 161 is input to the voice signal blocker 163 through the signal connector, the acceleration signal is converted to a digital acceleration signal DS1, and the digital acceleration signal DS1 is supplied to the tone discriminator 163b. The signal interrupter 163c is implemented by an analog switch. The tone discriminator 163b is implemented by software.

The tone discriminator 163b carries out the above-described analysis on the digital acceleration signal DS1, and changes a state signal S3 between an active high level and an inactive low level. When the tone discriminator 163b admits the vibrations of sound board 130 due to the intentionally produced tones, the tone discriminator 163b changes the state signal S3 to the active high level. On the other hand, when the tone discriminator 163b determines that the sound board 130 vibrates due to noise, the tone discriminator 163b changes the state signal S3 to the inactive low level.

The state signal S3 is supplied from the tone discriminator 163b to the control node of the signal interrupter 163c. The voice signal S2 is supplied from the signal inputs 163a to the signal input node of signal interrupter 163c. While the state signal S3 is staying at the inactive low level, the signal interrupter 163c is transparent to the voice signal S2, and the voice signal S2 reaches the sound system 162. As a result, the loud voice is radiated from the loudspeakers. On the other hand, when the state signal S3 is changed to the active high level, the signal interrupter 163c does not permit the voice signal S2 to reach the sound system 162. In this situation, even if the player P talks, the talk assisting system 16 does not respond to the voice.

Thus, the talk assisting system 16 keeps itself inactive on the condition that the player P produces the acoustic piano tones through the upright piano 100, and is activated on the condition that the player P talks without any fingering on the keyboard 110. As a result, the audience clearly hears both of the talk and piano performance.

Hardware and Software of Voice Signal Blocker

The headset microphone 161 is connected to a power supply line 163e through a power supply switch 163f. When the player P turns the power supply switch 163f on, the power voltage is supplied from the headset microphone 161. The vibration sensor 160 is also powered from the power supply line 163e.

The voice signal blocker 163 includes an intermediate voltage generator 163h, a comparator 163j and a sample and hold circuit 163k. The intermediate voltage generator 163h produces an intermediate voltage at all times, and the intermediate voltage is compared with the input voltage, which is supplied to the headset microphone 161, by means of the comparator 163j. While the power supply switch 163f is being turned off, the input voltage is equal to the ground level, and is lower than the intermediate voltage. For this reason, the comparator 163j keeps a power-on signal S4 in the inactive low level. On the other hand, when the player P turns on the power supply switch 163f, the input voltage exceeds the intermediate voltage, and the comparator 163j changes the power-on signal S4 to the active high level. The power-on signal S4 is representative of a piece of status data, which expresses whether or not the headset microphone 161 is powered.

The vibration sensor 160 is connected to the sample and hold circuit 163k so that the acceleration signal S1 is input to the sample and hold circuit 163k. The acceleration signal S1 is periodically sampled by means of the sample and hold circuit 163k, and the sampled values of acceleration signal S1 are converted to the digital acceleration signal DS1. Pieces of acceleration data express the sampled values of digital acceleration signal DS1.

The voice signal blocker 163 further includes data buffers 163m, a microprocessor 163n, a program memory 163p, a working memory 163r, a signal driver 163s and a shared bus system 163t. The data buffers 163m, microprocessor 163n, program memory 163p, working memory 163r and signal driver 163s are connected to the shared bus system 163t so that the microprocessor 163n is communicable with the data buffers 163m, program memory 163n, working memory 163r and signal driver 163s through the shared bus system 163t.

The comparator 163j and sample and holding circuit 163k are connected to the data buffers 163m, and the piece of status data and pieces of acceleration data are temporarily stored in the data buffers 163m.

The microprocessor 163 has an origin of information processing capability. A computer program is stored in the program memory 163p, runs on the microprocessor 163n. The instruction codes of computer program are sequentially fetched by the microprocessor 163n so as to achieve tasks expressed by the instruction codes.

A status flag, a counter, registers and a software timer are defined in the working memory 163r, and a predetermined number n of memory locations are assigned to n pieces of vibration data to be accumulated. The pieces of vibration data are produced on the basis of the pieces of acceleration data, and express the waveform of vibrations. The status flag is indicative of whether or not the headset microphone 161 is powered. A stored value c of the counter is indicative of the number of pieces of vibration data expressing the displacement of sound board 130 due to the intentionally produced acoustic piano tone.

The software timer is periodically incremented by the microprocessor 163n, and is used for timer interruptions. When software timer reaches a predetermined time period, the timer interruption takes place, and the software timer is reset to zero.

The n pieces of vibration data are stored in the n memory locations, respectively. When a new piece of vibration data is transferred to the working memory 163r, the first to $(n-1)^{th}$ pieces of vibration data are shifted from the first to $(n-1)^{th}$ memory locations to the second to $n^{th}$ memory locations, respectively, so that the $n^{th}$ piece of vibration data is pushed out. The new piece of vibration data is stored in the first memory location.

The signal driver 163s is responsive to a piece of control data expressing the tones or noise, and changes the state signal S3 between the active high level and the inactive low level.

The computer program has a main routine program and subroutine programs. One of the subroutine programs is assigned to the function to accumulate pieces of vibration data, and the main routine program periodically branches to the subroutine program for the accumulation through the timer interruption. Another subroutine program is assigned to the function of software timer, and the main routine program periodically branches to the subroutine program for incrementing the software timer through other timer interruptions.

Yet another subroutine program is assigned to a function to determine the displacement of sound board 130. The microprocessor 163n determines the displacement of sound board 130 on the basis of the pieces of acceleration data, and retrieves the waveform of vibrations of sound board 130. The pieces of vibration data express the displacement of sound board 130, i.e., the waveform of vibrations, and the pieces of vibration data are accumulated in the working memory 163r.

Figure 4A:
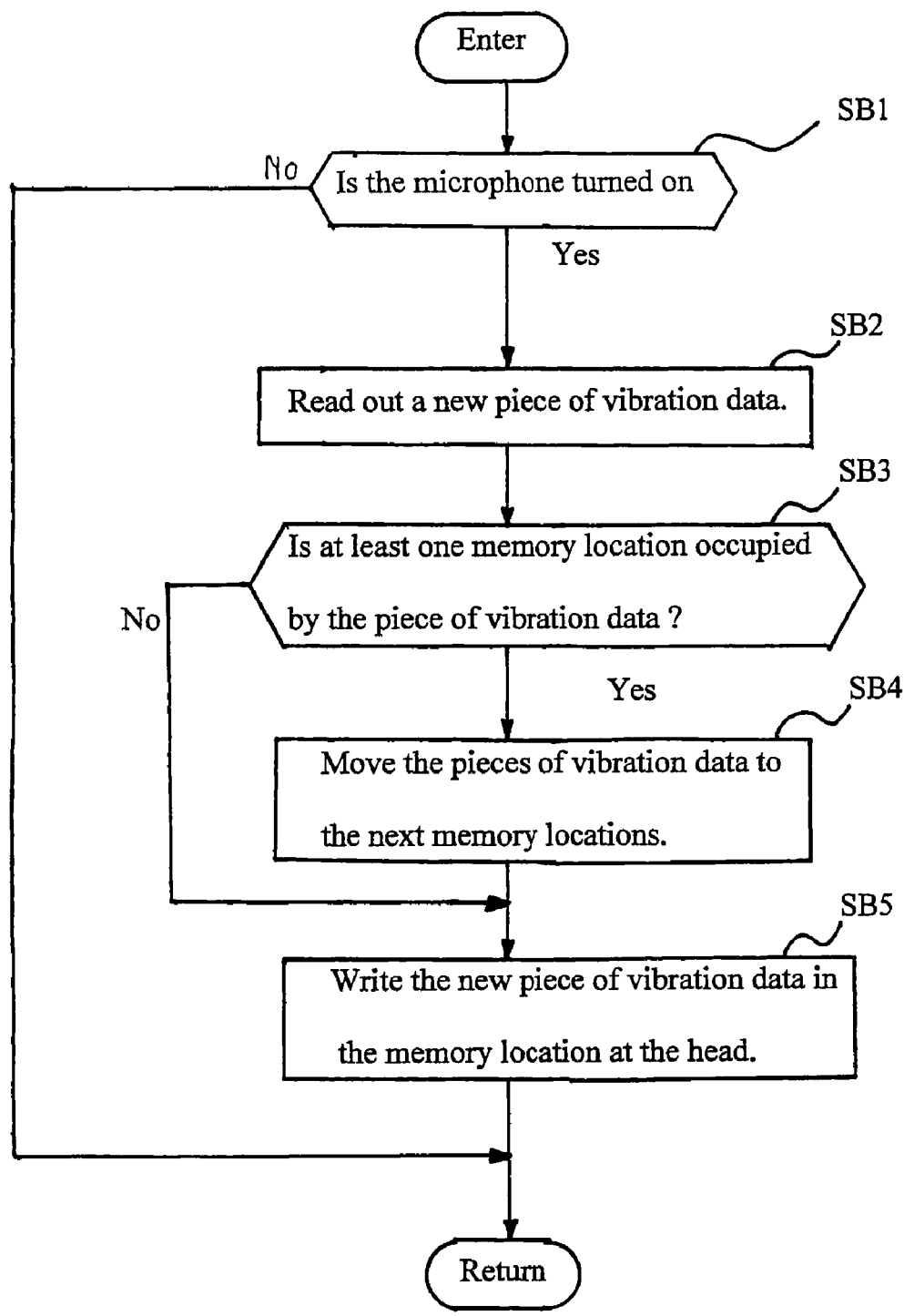
FIG. 4A is a flowchart showing a job sequence for accumulating pieces of acceleration data.

FIG. 4A shows a job sequence of the subroutine program for the accumulation. When the timer interruption takes place, the main routine program branches to the subroutine program shown in FIG. 4A.

Upon entry into the subroutine program, the microprocessor 163n checks the working memory 163r to see whether or not the player P has turned on the headset microphone 161 as by step SB1. While the headset microphone 161 is being turned off, the flag is taken down, and the answer at step SB1 is given negative "No". With the negative answer "No", the microprocessor 163n immediately returns to the main routine program.

On the other hand, when the headset microphone 161 is turned on, the flag is raised, and the answer at step SB1 is given affirmative "Yes". With the positive answer "Yes", the microprocessor 163n reads out a new piece of vibration data from the working memory as by step SB2, and temporarily stores the new piece of vibration data in the register. Though not shown in FIG. 4A, the piece of status data expressing the power-on or power-off is also fetched by the microprocessor 163n, and the microprocessor 163n raises or takes down the flag expressing the piece of status data.

Subsequently, the microprocessor 163n checks the working memory 163r to see whether or not at least one piece of vibration data occupies the memory locations as by step SB3. If any piece of vibration data is not found in the memory locations, the answer at step SB3 is given negative "No", and the microprocessor 163n proceeds to step SB5.

On the other hand, when the microprocessor 163n finds at least one piece of vibration data, the answer at step SB3 is given affirmative "Yes", and the microprocessor 163n moves the piece or pieces of vibration data from the present memory locations to the next memory locations as by step SB4. For example, in case where the n pieces of vibration data occupy the first to $n^{th}$ memory locations, the first to $(n-1)^{th}$ pieces of vibration data are moved from the first to $(n-1)^{th}$ memory locations to the second to $n^{th}$ memory locations, respectively, so that the $n^{th}$ piece of vibration data is pushed out from the $n^{th}$ memory location.

When the job at step SB4 is completed, or when the answer at step SB3 is given negative "No", the microprocessor 163n writes the new piece of vibration data in the first memory location as by step SB5. Upon completion of the job at step SB5, the microprocessor 163n returns to the main routine program.

When the player P turns off the headset microphone 161, the piece of status data expressing the power-off state is fetched at step SB2, and the flag is taken down. As a result, when the next timer interruption takes place, the answer at step SB1 is changed from affirmative to negative, and the microprocessor 163n immediately returns from the subroutine program to the main routine program.

Figure 4B:
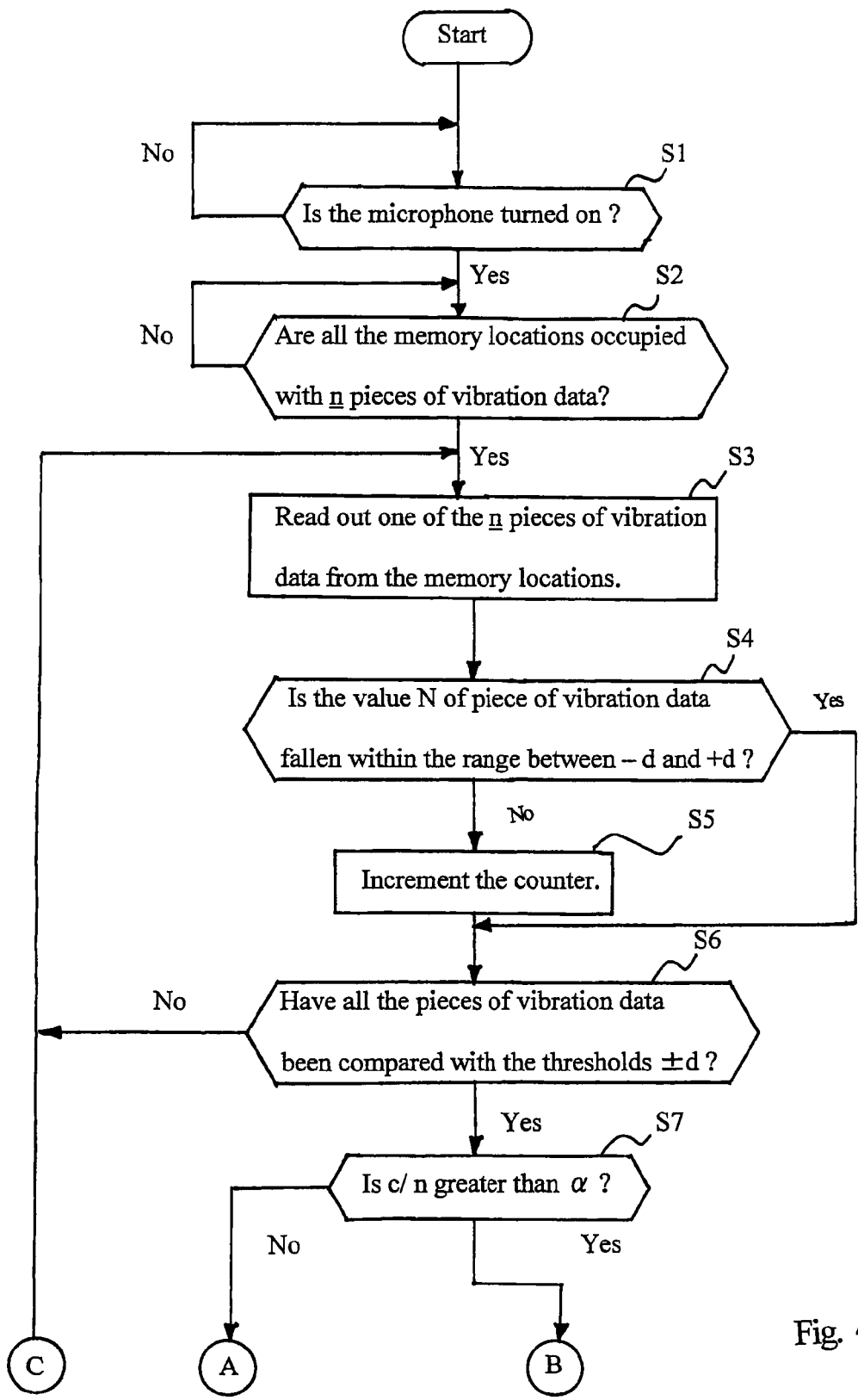
FIGS. 4B and 4C are flowcharts showing a job sequence for discriminating tones from noise.
Figure 4C:
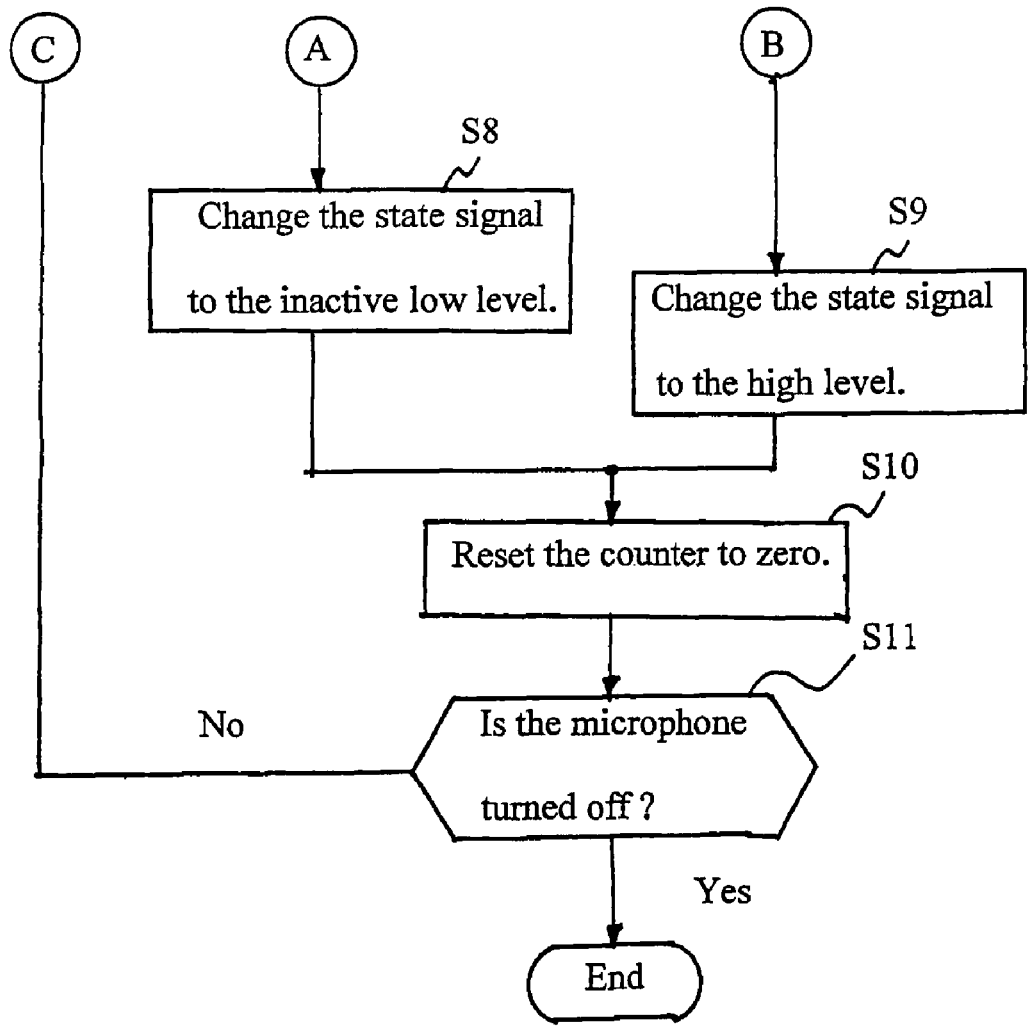

Turning to FIGS. 4B and 4C, the main routine program expresses jobs at steps S1 to S12. Although the main routine program further expresses other jobs such as, for example, a job for a system initialization, these other jobs are deleted from the main routine program for the sake of simplicity.

Figure 5:
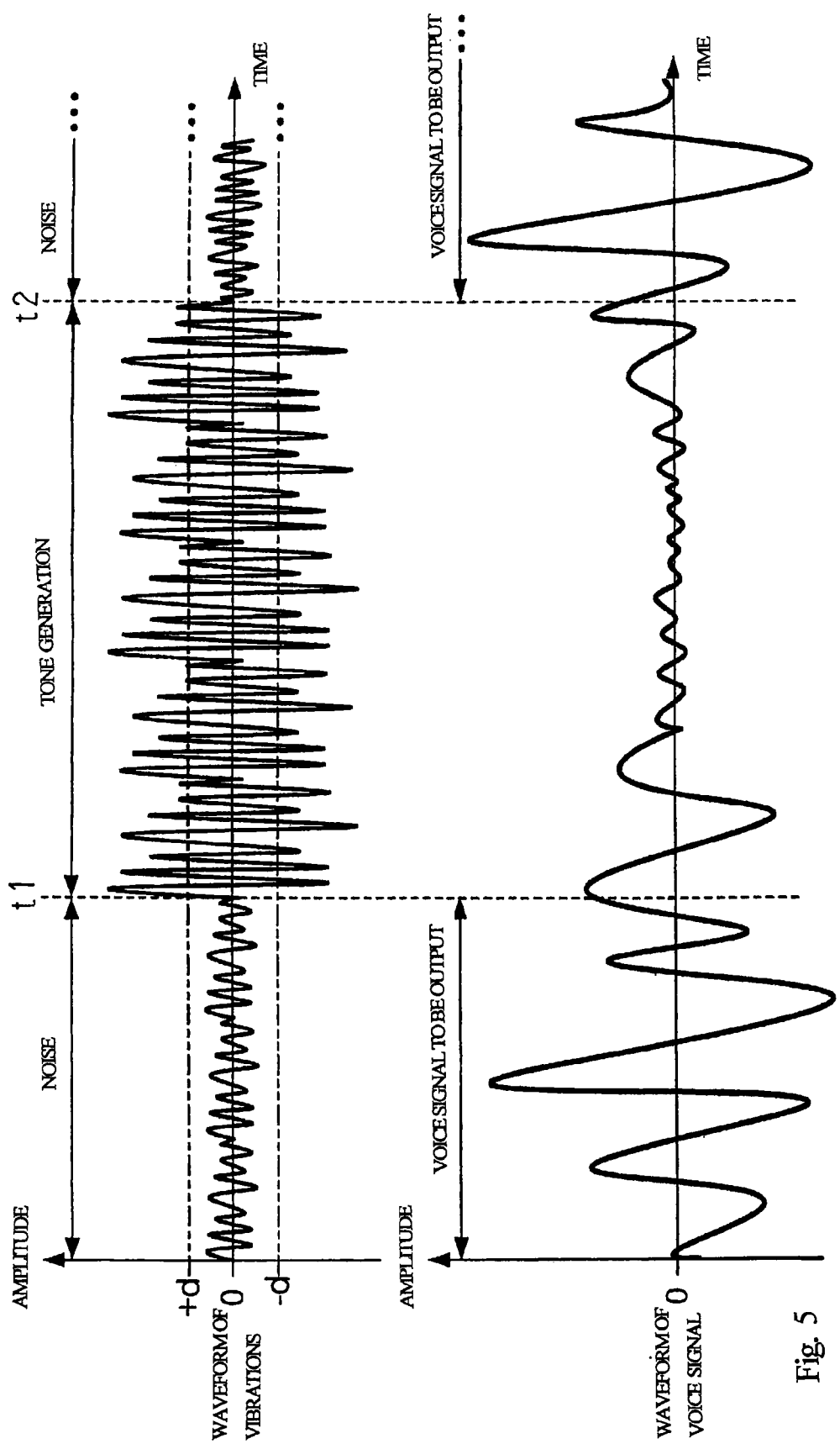
FIG. 5 is a graph showing a waveform of vibrations and a waveform of a voice signal.

FIG. 5 shows a waveform of the vibrations of sound board 130 and a waveform of the voice signal, and the pieces of vibration data express the waveform of the vibrations of sound board 130. The jobs in main routine program are hereinafter described with concurrent reference to FIGS. 4B, 4C and 5.

The microprocessor 163n checks the flag assigned to the status data to see whether or not the player P turns on the power supply switch 163f as by step S1. While the headset microphone 161 is being isolated from the power voltage, the intermediate voltage is higher than the input voltage, and the comparator 163j keeps the power-on signal S4 in the inactive low level. The microprocessor 163n fetches the piece of status data expressing either active high level of inactive low level from the data buffers 163m, and raises or takes down the flag.

If the flag is indicative of the power-off state, the answer at step S1 is given negative "No", and the microprocessor 163n repeats the job at step S1 until the answer is changed.

If the player P turns on the power supply switch 163f, the microprocessor 163n raises the flag during the execution of subroutine program shown in FIG. 4A, and the answer at step S1 is changed to affirmative "Yes".

With the positive answer "Yes" at step S1, the microprocessor 163n checks the working memory 163r to see whether or not the pieces of vibration data occupy all the memory locations as by step S2. When the answer at step S2 is given negative "No", the microprocessor 163n repeats the job at step S2 until the n pieces of vibration data are written in all of the memory locations.

When the n pieces of vibration data occupy all the memory locations, the answer at step S2 is changed to affirmative "Yes", and the microprocessor 163n transfers the n pieces of vibration data from the n memory locations to other memory locations. Thus, the microprocessor specifies the n pieces of vibration data to be examined. Thereafter, the microprocessor reads out the $n^{th}$ piece of vibration data from the memory location as by step S3, and checks the $n^{th}$ piece of vibration data to see whether or not the $n^{th}$ piece of vibration data expresses the intentionally produced tone as by step S4. When the sound board 130 is vibrating due to the collision between the hammer 122 and the associated string 134, the sound board 130 widely vibrates, and the vibration data contains the data pieces, which express values N out of a range between –d and +d, and the percentage of these pieces of vibration data is more than a critical percentage α%. On the other hand, when the sound board 130 vibrates due to noise, the pieces of vibration data have respective values N fallen within the range between –d and +d.

The sound board 130 is assumed to vibrate due to noise as between time 0 to time t1 in FIG. 5. The values N of pieces of vibration data are varied within the range between –d and +d. In this situation, the positive answer "Yes" is repeated at step 4, and the microprocessor 163n proceeds to step S6 without any increment of the counter at step S5. The microprocessor 163n checks the working memory 163r to see whether or not all of the n pieces of vibration data are examined at step S6.

While the answer at step S6 is being given negative "No", the microprocessor 163n returns to step S3, and compares the next piece of vibration data with the range between –d and +d. All of the pieces of vibration data between time 0 to time t1 are repeatedly fallen within the range between –d and +d, and the counter keeps the value c zero.

When all of the n pieces of vibration data are examined, the answer at step S6 is changed to affirmative "Yes", and the microprocessor 163n compares the percentage of c/n with the critical percentage α as by step S7. The noise usually makes the sound board 130 vibrate within the rage between –d and +d. Even if the noise causes the sound board 130 momentarily to vibrate outside the range between –d and +d, the percentage of pieces of vibration data exceeding the range is less than the critical percentage α, and the answer step S7 is repeatedly given negative "No". The critical percentage α is determined in consideration of the value of threshold±d. In case where the threshold±d is large enough to eliminate the noise from the pieces of vibration data, α may be determined to be 1.

With the negative answer "No", the microprocessor 163n changes the state signal S3 to the inactive low level as by step S8. As a result, the voice signal S2 is input to the sound system 162, and the voice is radiated from the loudspeakers 162b at large loudness.

Subsequently, the microprocessor 163n resets the counter to zero as by step S10, and checks the working memory 163r to see whether or not the player P turns off the power supply switch 163f as by step S11. While the headset microphone 161 is active, the answer at step S11 is given negative "No", and the microprocessor 163n returns to step S3. The microprocessor 163n transfers the n pieces of vibration data from the n memory locations to the other memory locations, and specifies the pieces of vibration data to be examined. Thus, the microprocessor 163n reiterates the loop consisting of steps S3 to S11 on the condition that the player P keeps the headset microphone 161 active.

While the sound board 130 is vibrating due to the noise as between time 0 to time t1, the answer at step S7 is repeatedly given negative "No", and the player P talks to the audience with the assistance of the talk assisting system 16.

The player P starts to finger a piece of music on the keyboard 110 at time t1, A set of n pieces of vibration data is transferred from the n memory locations to the other memory locations after time t1, and the microprocessor 163n starts to examine the n pieces of vibration data at step S3. As illustrated in FIG. 5, the sound board 130 widely vibrates, and the counter is repeatedly incremented at step S5.

When the last piece of vibration data is compared with the range between −d and +d, the value c of counter makes the percentage of c/n equal to or greater than the critical percentage α. For this reason, the answer at step S7 is given affirmative "Yes", and the microprocessor 163n changes the state signal S3 to the active high level as by step S9. In more detail, the microprocessor 163n supplies the piece of control data expressing the active high level to the signal driver 163s, and the signal driver 163s changes the state signal S3 to the active high level. The state signal S3 is supplied to the signal interrupter 163c, and makes the signal interrupter 163c opaque to the voice signal S2. Even if the player P pronounces, the talk assisting system 16 does not enlarge the voice. Thus, both of the voice and tones are not concurrently enlarged. Since the audience hears the voice and tones separately, the audience feels the voice and tones comfortable.

As will be understood, the talk assisting system 16 permits the voice to be enlarged through the sound system 162 under the condition that any tone is not intentionally produced through the vibrations of sound board 130, and blocks the sound system 162 from the voice signal S2 during the vibrations of sound board 130 due to the collision between the hammers 122 and the strings 134. Thus, the intentionally produced tones are not mixed with the enlarged voice. This results in that the audience hears both of the talk and performance comfortable.

Second Embodiment

Figure 6:
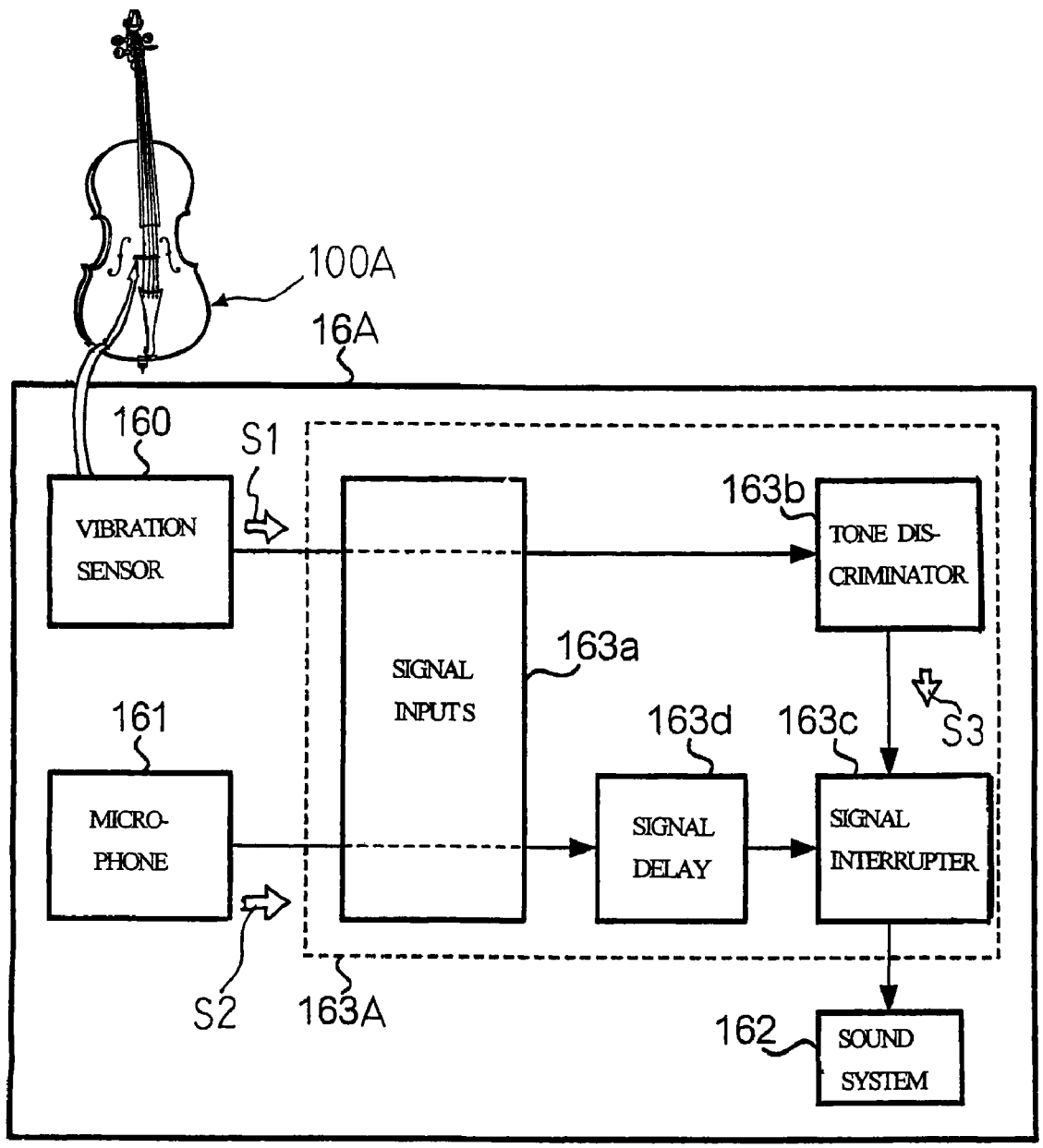
FIG. 6 is a block diagram showing the system configuration of another talk assisting system incorporated in a stringed musical instrument of the present invention.

Turning to FIG. 6 of the drawings, another talk assisting system 16A embodying the present invention largely comprises a vibration sensor 160, a microphone 161, a sound system 162 and a voice signal blocker 163A. The talk assisting system 16A is similar to the talk assisting system 16 except for the voice signal blocker 163A. For this reason, the vibration sensor 160, microphone 161 and sound system 162 are labeled with the references designating the corresponding system components of talk assisting system 16 without detailed description.

The talk assisting system 16A is, by way of example, used by a cellist, and the vibration sensor 160 is fitted to a bridge of a cello 100A. The vibration sensor 160 may be fitted to a tailpiece. The vibration sensor 160 and microphone 161 are connected to the voice signal blocker 163A, and the voice signal blocker 163A is connected to the sound system 162.

The voice signal blocker 163A includes signal inputs 163a, a tone discriminator 163b, a signal interrupter 163c and a signal play 163d. The signal inputs 163a, tone discriminator 163b and signal interrupter 163c are similar to those of the voice signal blocker 163, and no further description hereinafter is incorporated for the sake of simplicity.

The signal delay 163d is implemented by an analog delay line, and is connected between the signal inputs 163a and the signal interrupter 163c. The signal delay 163d introduces delay in the propagation of the voice signal S2 from the signal inputs 163a to the signal interrupter 163c.

The signal delay 163d is advantageous on the condition that the threshold±d has a large absolute value. The large absolute value is desirable for the player P for perfect elimination of noise. However, the large absolute value of threshold±d makes the boundary between the noise and the tones vague. In other words, the tone discriminator 163b tends to recognize the attack of tone as noise due to the large absolute value of threshold±d. If the player P starts to talk sufficiently after the completion of fingering, voice is surely enlarged through the sound system 162. However, when the player P starts to talk immediately after producing the last tone, the tone discriminator 163b keeps the state signal S3 in the active high level at the initiation of talk, and, as a result, player's voice is partially lost.

Figure 7:
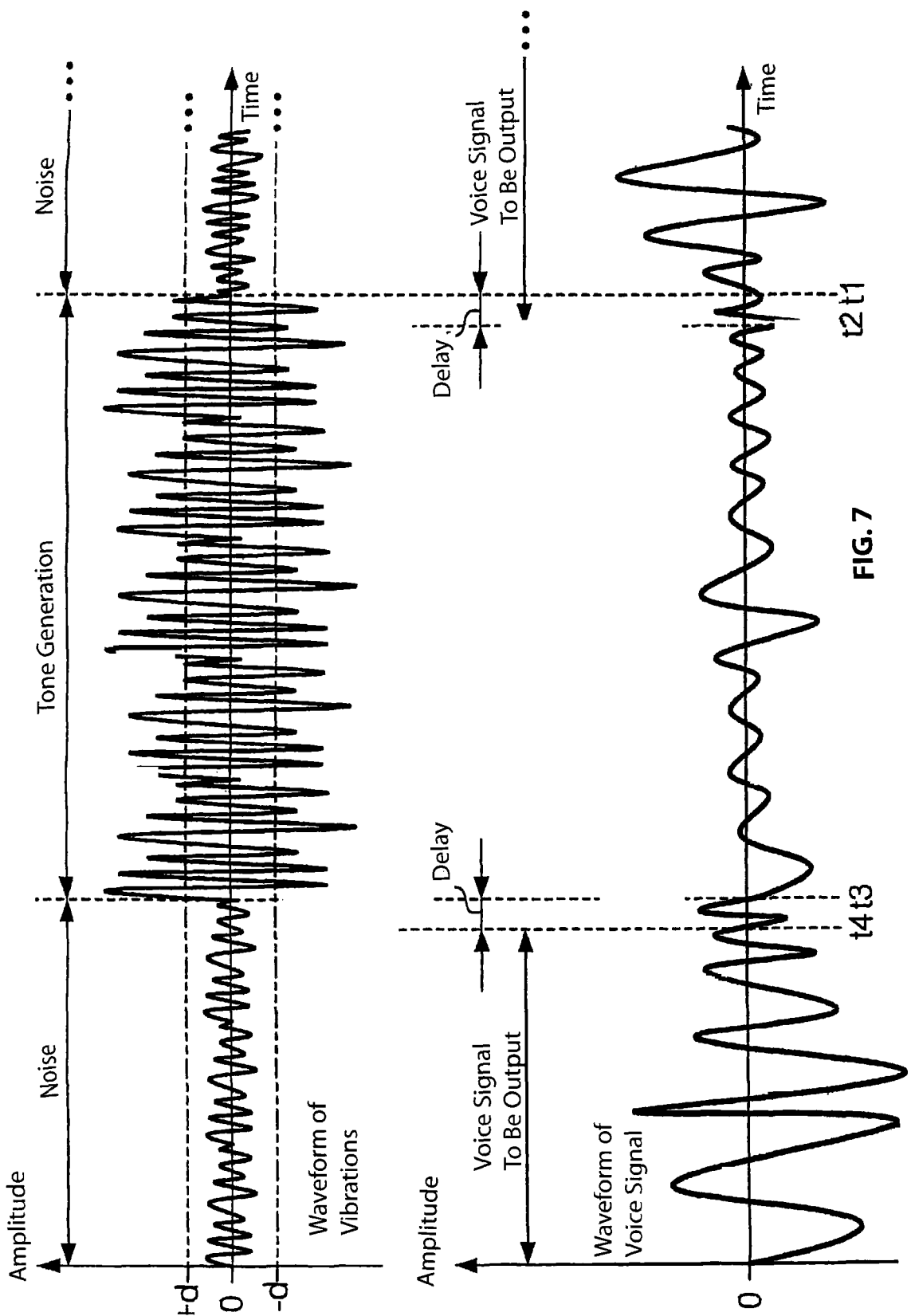
FIG. 7 is a graph showing a waveform of vibrations and a waveform of a voice signal under the condition of a large absolute value of threshold.

In order to prevent the player P from the loss of voice, the voice signal S2 is delayed through the signal delay 163d. FIG. 7 shows the waveform of vibrations and the waveform of voice under the condition of a large absolute value of threshold±d. Assuming now that the player P starts to player a piece of music immediately after the completion of talk at time t4, the tone discriminator 163b recognizes the tone at time t3 due to the large absolute value of threshold±d, and changes the state signal S3 from the inactive low level to the active high level at time t3. However, the signal delay 163d introduces the delay time in the propagation of voice signal S2 so that the signal interrupter 163c blocks the sound system 162 from the noise as if the state signal S3 is changed to the active high level at time t4.

Similarly, even if the player P starts to talk at time t2, the tone discriminator 163b recognizes that the tone is decayed at time t1. However, the signal delay 163d introduces the delay time in the propagation of voice signal S2. The signal interrupter 163c permits the voice signal S2 to reach the sound system 162 as if the state signal S3 is changed to the inactive low level at time t2. As a result, the voice between time t1 and time t2 is enlarged through the sound system 162.

As will be understood from the foregoing description, the talk assisting system 16A permits the voice to be enlarged through the sound system 162 under the condition that any tone is not intentionally produced through the vibrations of sound board 130, and blocks the sound system 162 from the voice signal S2 during the vibrations of sound board 130 due to the collision between the hammers 122 and the strings 134. Thus, the intentionally produced tones are not mixed with the enlarged voice. This also results in that the audience hears both of the talk and performance comfortable.

Moreover, the signal delay 163d makes it possible to enlarge the absolute value±d. As a result, the talk assisting system 16A perfectly eliminates the noise from the enlarged sound without missing a part of the voice.

Third Embodiment

Figure 8:
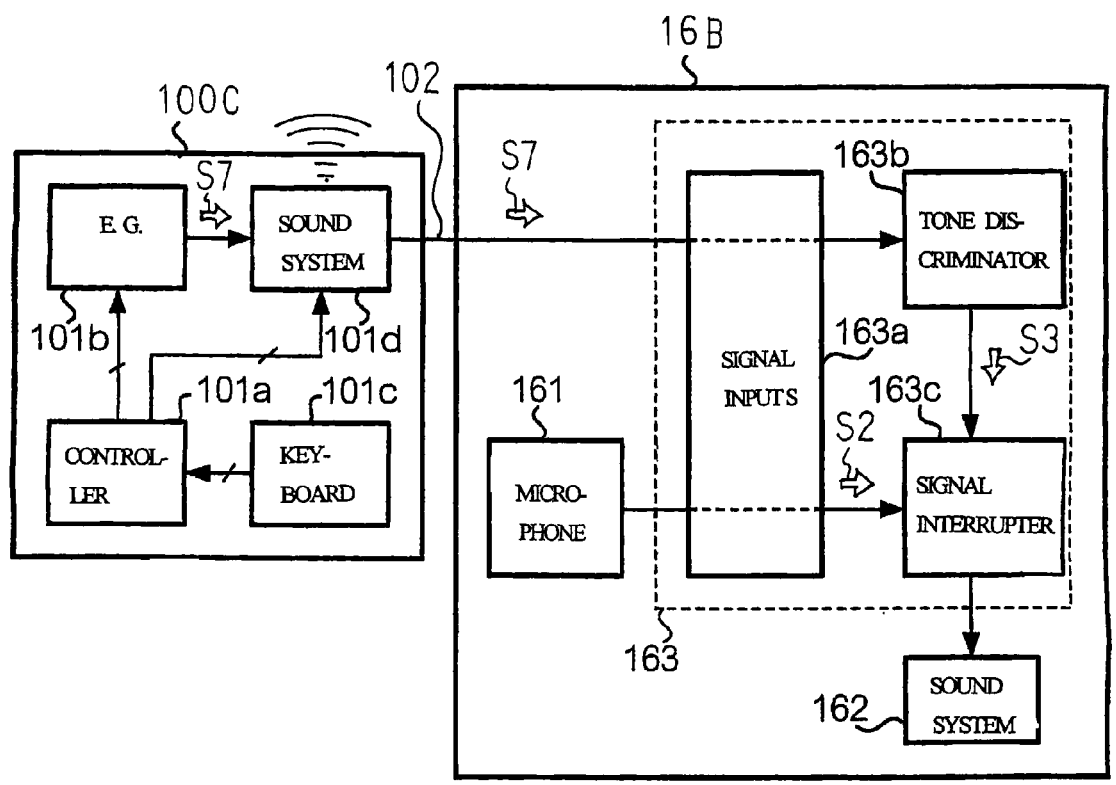
FIG. 8 is a block diagram showing the system configuration of yet another talk assisting system incorporated in an electronic musical instrument of the present invention.

Turning to FIG. 8 of the drawings, yet another talk assisting system 16B embodying the present invention is provided in association with an electronic piano 100C, and largely comprises a microphone 161, a sound system 162 and a voice signal blocker 163. However, any vibration sensor is not incorporated in the talk assisting system 16B. The microphone 161, sound system 162 and voice signal blocker 163 are similar to those of the talk assisting system 16. For this reason, any detailed description on these system components 161, 162 and 163 are not hereinafter incorporated for the sake of simplicity.

The electronic piano 100C includes a controller 101a, an electronic tone generator 101b, which is abbreviated as "E.G." in FIG. 8, a keyboard 101c and a sound system 101d. The controller 101a includes an information processing system, i.e., a microprocessor, a program memory, a working memory and so forth, and is connected to the keyboard 101c, electronic tone generator 101b and sound system 101d.

The keyboard 101c has plural keys, which are independently depressed and released by a player, and the movements of keys are analyzed through the controller 101a. The controller 101a periodically checks the keyboard 101c to see whether or not the player depresses and releases any one of the keys. When the controller 101a finds a depressed key and a released key, the controller 101a determines the note number assigned to the depressed keys and released keys, key velocity, timing to produce electronic tones and timing to decay the electronic tones, and produces music data codes expressing the tones to be produced, loudness of the tones and tones to be decayed. The controller 101a supplies the music data codes to the electronic tone generators 101b and sound system 101d.

The electronic tone generator 101b has a waveform memory where pieces of waveform data are stored, and successively reads out the pieces of waveform data from the waveform memory on the basis of the music data codes expressing the depressed keys. The electronic tone generator 101b forms an audio signal S7 from the pieces of waveform data. The audio signal S7 is supplied to the sound system 101d, and is converted to electronic tones through the sound system 101d.

The audio signal S7 is further supplied to the signal inputs 163a through a signal cable 102, and the signal inputs 163a transfers the audio signal S7 to the tone discriminator 163b. The discrete values on the audio signal S7 are converted to the pieces of vibration data by the tone discriminator 163b. The tone discriminator 163b changes the state signal S3 between the active high level and the inactive low level through the analysis on the pieces of vibration data as similar to that of the first and second embodiments.

The signal interrupter 163c is responsive to the state signal S3 so as to pass and interrupt the voice signal S2. Thus, the audio signal S7 is directly supplied from the electronic piano 100C to the voice signal blocker 163. For this reason, any vibration sensor is not required for the talk assisting system 16B.

There is little possibility that noise is mixed in the audio signal S7. For this reason, the threshold±d has an extremely small absolute value. The talk assisting system 16B achieves the advantages of the first embodiment.

Fourth Embodiment

Figure 9:
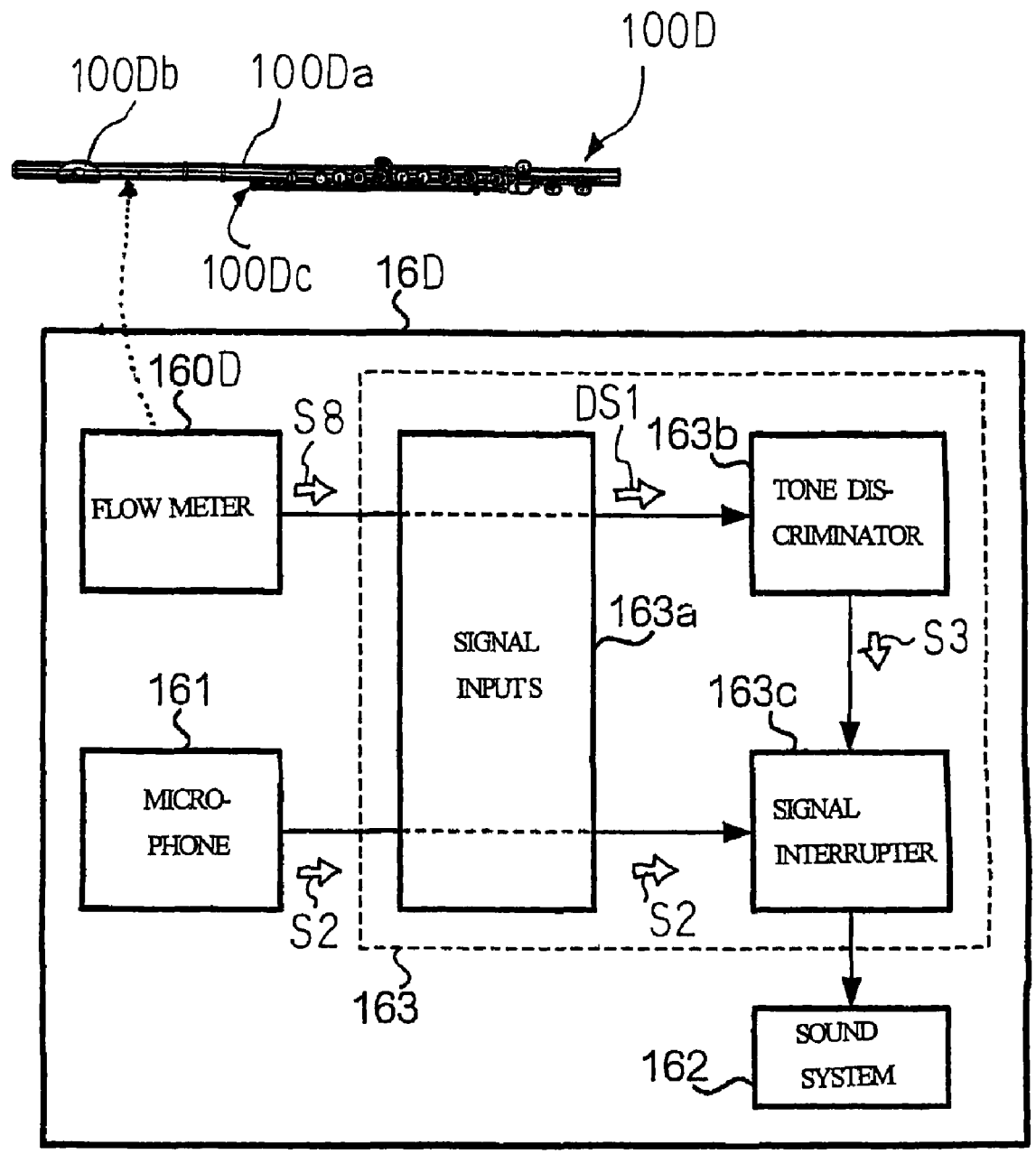
FIG. 9 is a block diagram showing the system configuration of still another talk assisting system incorporated in a wind musical instrument of the present invention.

Turning to FIG. 9 of the drawings, still another talk assisting system 16D embodying the present invention is provided in association with a flute 100D, and largely comprises a flow meter 160D, a microphone 161, a sound system 162 and a voice signal blocker 163. The microphone 161, sound system 162 and voice signal blocker 163 are similar to those of the talk assisting system 16. For this reason, any detailed description on these system components 161, 162 and 163 are not hereinafter incorporated for the sake of simplicity.

The flute 100D includes a tubular body 100Da, a mouthpiece 100Db and a key mechanism 100Dc. A hole is defined in the mouthpiece, and a player blows into the tubular body 100Da through the hole. An inner space is defined in the tubular body 100Da, and a column of vibratory air takes place in the tubular body 100Da. The key mechanism 100Dc is provided on the outer surface of the tubular body 100Da, and the player selectively closes and opens tone holes, which are formed in the tubular body 100Da, by means of the key mechanism 100Dc for changing the pitch of tones.

While the player is blowing into the tubular body 100Da through the mouthpiece 100Db, the column of air vibrates, and the tones are produced through the vibrations of air column.

The flow meter 160D is provided inside the tubular body 100Da, and is connected to the signal inputs 163a through a cable. The flow meter 160D may be replaced with an air pressure sensor or a current meter. Since the flow meter 160D is obstacle against the vibrations of air column, it is desirable that the flow meter 160D is as thin as possible.

While the player is blowing into the tubular body 100Da, a detecting signal S8 expressing the amount of air flow is supplied from the flow meter 160D to the signal inputs 163a, and the discrete values of detecting signal S8 are converted to binary codes of pieces of air flow data. The tone discriminator 163b compares the binary codes with a threshold to see whether or not the player starts to blow. When the binary code exceeds the threshold, the tone discriminator 163b changes the state signal S3 to the active high level. The signal interrupter 163c is responsive to the state signal S3 so as to pass and interrupt the voice signal S2.

The talk assisting system 16D achieves the advantages of the first embodiment.

Fifth Embodiment

Figure 10:
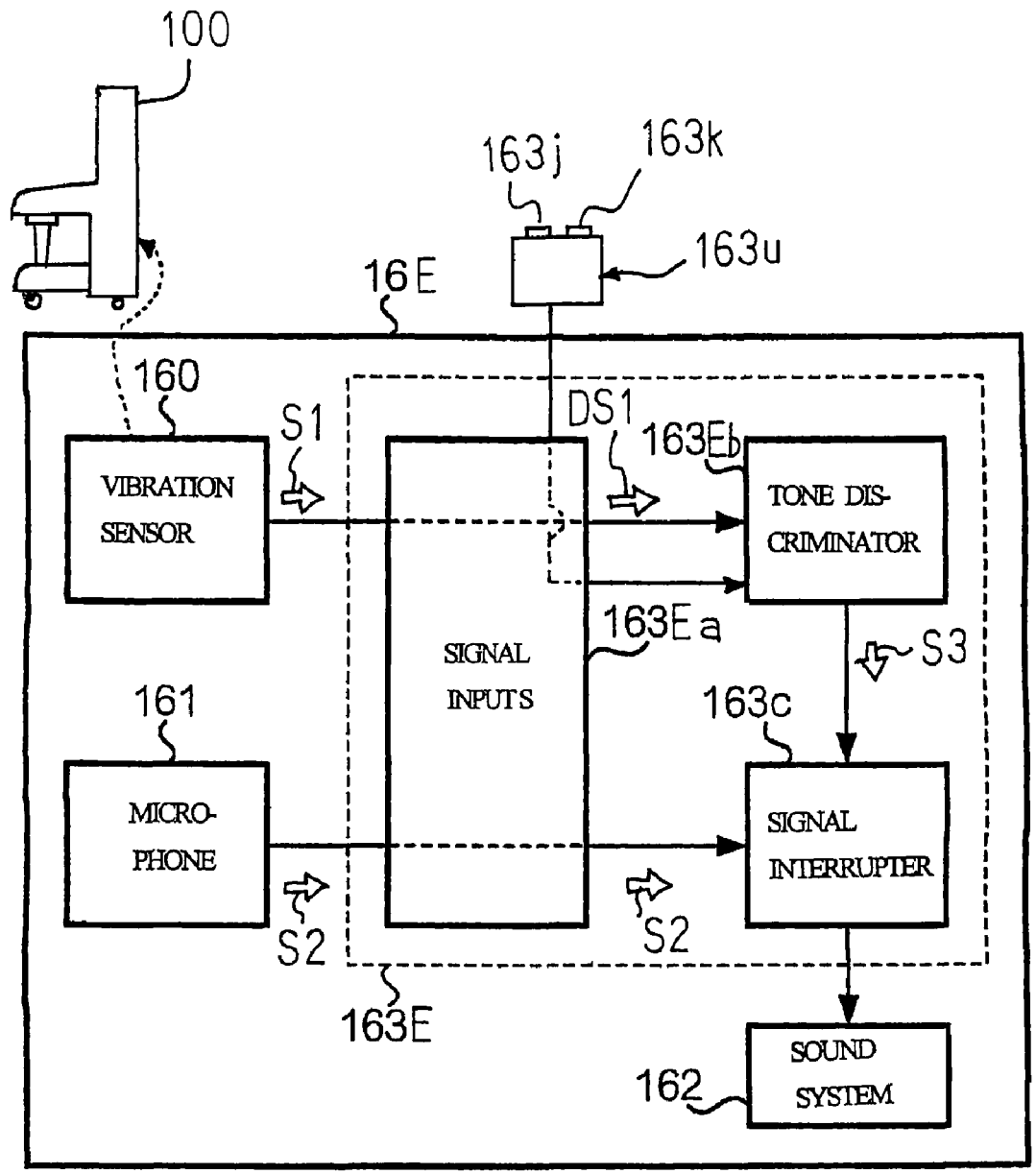
FIG. 10 is a block diagram showing the system configuration of yet another talk assisting system of the present invention.

Turning to FIG. 10 of the drawings, yet another talk assisting system 16E embodying the present invention is provided in association with an upright piano 100, and largely comprises a vibration sensor 160, a microphone 161, a sound system 162 and a voice signal blocker 163E. The upright piano 100, vibration sensor 160, microphone 161 and sound system 162 are similar to the upright piano 100 of the first embodiment and those of the talk assisting system 16. For this reason, any detailed description on these system components 100, 160, 161 and 162 are not hereinafter incorporated for the sake of simplicity.

The voice signal blocker 163E includes signal inputs 163Ea, a tone discriminator 163Eb, a signal interrupter 163c and a threshold changer 163u. The tone discriminator 163b is similar to that of the first embodiment. The threshold changer 163u has two button switches 163j and 163k, and is connected through the signal inputs 163Ea to the tone discriminator 163Eb.

A player once pushes the button switch 163j so as to increment the absolute value of threshold±d by a predetermined value, and once pushes the other button switch 163k so as to decrement the absolute value of threshold±d by the predetermined value. When the button switch 163j is pushed, the threshold changer 163u supplies an increment signal to the signal inputs 163Ea. When the button switch 163k is pushed, the threshold changer 163u supplies a decrement signal to the signal inputs 163Ea. The microprocessor 163n periodically checks the signal buffers assigned to the increment signal and decrement signal to see whether or not the player pushes any one of the button switches 163j and 163k. When the microprocessor 163n acknowledges 163n the request for increment or the request for decrement, the microprocessor changes the threshold±d by the predetermined value. Thereafter, the microprocessor 163n compares the pieces of vibration data with the range defined by the new threshold at step S4.

As will be understood from the foregoing description, the talk assisting system 16E achieves the advantages of the first embodiment. Moreover, the player can adjust the threshold to appropriate value. As a result, the player can perfectly eliminate the tones from the voice signal.

Although particular embodiments of the present invention have been shown and described, it will be apparent to those skilled in the art that various changes and modifications may be made without departing from the spirit and scope of the present invention.

The vibration sensor 160 may be implemented by another sort of sensor such as, for example, a position transducer or a pressure sensor. The vibration sensor 160 may be attached to another component part of the musical instrument.

The vibration sensor 160 and microphone 161 may supply the acceleration signal and voice signal to the voice signal blocker 163 through radio channels.

The musical instrument equipped with the talk assisting system of the present invention is available for a remote concert and a remote music lesson.

The upright piano 100, cello 100A, electronic keyboard 100B and flute 100D do not set any limit to the technical scope of the present invention. The talk assisting system of the present invention may be fitted to another sort of musical instrument such as, for example, percussion instruments. Moreover, the talk assisting system may appertain to non-musical instruments in so far as at least two sorts of sound are generated from at least two sorts of sound sources.

A talk assisting system of the present invention may have a signal input, which makes the player P to vary the amount of delay time. In this instance, the player P adjusts the delay time to an appropriate value to the player P.

The signal delay 163d may not introduce the delay time into the propagation of voice signal S2 at the initiation of voice, i.e., between time t2 and time t1. In this instance, the tone is not mixed in the voice between time t1 and time t2.

The computer program may be version-upped. In this instance, the computer program is stored in a rewritable non-volatile memory such as, for example, a flash memory, and a new computer program is supplied to the rewritable non-volatile memory through a compact disk or the internet.

The component parts and jobs are correlated with claim languages as follows. The microphone 161 is corresponding to a "voice-to-signal converter", and the signal inputs 163 and 163Ea serve as a "signal interface". The acceleration signal S1, audio signal S7 and detecting signal S8 serve as a "detecting signal", and the vibration sensors 160, electronic tone generator 101b and flow meter 160D are corresponding to a "sound detector" or "music sound detector". The state signal at the active high level is corresponding to a "blocking signal".

The keyboards 110 and 101c, strings of cello 100A and key mechanism 100Dc serve as "plural manipulators". The action units 120, hammers 122, strings 134, dampers 140 and piano cabinet 111. which includes the sound board 130, as a whole constitute a "tone generator", and the controller 101a, electronic tone generator 101b and sound system 101d also constitute the "tone generator". The tubular body 100Da and mouthpiece 100Db also constitute the "tone generator".

The microprocessor 163n, jobs of subroutine program for producing the pieces of vibration data and jobs at steps SB1, SB2, SB3, SB4, SB5 serve as a "vibration data producer", and the microprocessor 163n and jobs at steps S3, S4, S5, S6 and S7 serve as a "comparator". The microprocessor 163n, signal driver 163s and jobs at steps S8 and S9 serve as a "signal generator". The vibration sensors 160 serve as a "vibration-to-signal converter", and the cable, which is connected between the sound system 101d and the signal inputs 163a also serve as a "signal propagation path".

What is claimed is:

1. A musical instrument for producing music sound, comprising:
    plural manipulators selectively depressed and released for specifying tones to be produced;
    a tone generator connected to said plural manipulators, and producing said tones as music sound; and
    a talk assisting system including
        a voice-to-signal converter picking up voice of a player and converting said voice to a voice signal,
        a music sound detector monitoring said tone generator and producing a detecting signal representative of generation of said music sound,
        a sound system supplied with said voice signal and enlarging said voice, and
    a voice signal blocker having
        a signal interface connected to said voice-to-signal converter and said music sound detector and receiving said voice signal and said detecting signal,
        a music sound discriminator connected to said signal interface, checking pieces of music sound data expressed by said detecting signal to see whether or not said music sound is produced and producing a blocking signal representative of presence of said music sound when the pieces of music sound data express generation of said music sound and
        a signal interrupter connected between said signal inputs and said sound system, responsive to said blocking signal so as to block said sound system from said voice signal and permitting said voice signal to reach said sound system in the absence of said blocking signal.

2. The musical instrument as set forth in claim 1, in which said sound discriminator includes
    a vibration data producer connected to said signal interface and producing pieces of vibration data expressing a waveform of music sound from said pieces of music sound data,
    a comparator connected to said vibration data producer and comparing said waveform with a threshold value to see whether said waveform expresses said music sound or noise, and
    a signal generator connected to said comparator and producing said detecting signal when said waveform expresses said music sound.

3. The musical instrument as set forth in claim 2, in which said sound discriminator further includes
    a threshold changer connected to said comparator for supplying said threshold value to said comparator and varying said threshold value.

4. The musical instrument as set forth in claim 1, in which said voice signal blocker further includes
    a signal delay connected between said signal interface and said signal interrupter so as to introduce delay time in the propagation of said voice signal from the signal interface to said signal interrupter.

5. The musical instrument as set forth in claim 1, in which said voice-to-signal converter has a microphone provided around the mouth of said player.

6. The musical instrument as set forth in claim 1, in which said sound detector is formed by a vibration-to-signal converter connected to said tone generator so as to convert vibrations produced in a component part of said tone generator.

7. The musical instrument as set forth in claim 6, in which said tone generator includes
    action units connected to keys serving as said plural manipulators, respectively,
    hammers driven for rotation by said action units, respectively,
    strings opposed to said hammers, respectively, and struck with said hammers at end of said rotation so that vibrations take place, and
    a cabinet accommodating said action units, said hammers and said strings and having a vibratory member serving as said component part and vibrating together with said strings due to said vibrations.

8. The musical instrument as set forth in claim 1, in which said tone generator includes
- a tubular body defining a vibratory column of air and accommodating said music sound detector, and
- a mouthpiece connected to said tubular body and giving rise to vibrations of said vibratory column of air while a player blows thereinto.

9. The musical instrument as set forth in claim 1, in which said sound detector is formed by a signal propagation path connected to said tone generator electrically producing said music tones from an electric signal and so as to propagate said electric signal serving as said detecting signal to said signal inputs.

* * * * *